(12) United States Patent
Zhang et al.

(10) Patent No.: US 9,503,118 B2
(45) Date of Patent: Nov. 22, 2016

(54) MULTIPLYING ANALOG TO DIGITAL CONVERTER AND METHOD

(71) Applicants: Jintao Zhang, Princeton, NJ (US);
Zhuo Wang, Princeton, NJ (US);
Naveen Verma, Princeton, NJ (US)

(72) Inventors: Jintao Zhang, Princeton, NJ (US);
Zhuo Wang, Princeton, NJ (US);
Naveen Verma, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 15/049,752

(22) Filed: Feb. 22, 2016

(65) Prior Publication Data
US 2016/0248437 A1 Aug. 25, 2016

Related U.S. Application Data

(60) Provisional application No. 62/118,903, filed on Feb. 20, 2015.

(51) Int. Cl.
*H03M 1/38* (2006.01)
*H03M 1/44* (2006.01)

(52) U.S. Cl.
CPC .................... *H03M 1/442* (2013.01)

(58) Field of Classification Search
CPC .................. H03M 1/00; H03M 1/12; H03M 2201/1109; H03M 1/442
USPC ................. 341/155, 118, 161, 156
See application file for complete search history.

(56) References Cited

U.S. PATENT DOCUMENTS

| | | | | |
|---|---|---|---|---|
| 5,537,435 A | * | 7/1996 | Carney | H04J 1/05 370/210 |
| 8,248,280 B2 | * | 8/2012 | Zhan | H03M 1/46 341/118 |

OTHER PUBLICATIONS

Wang et al. "Error-Adaptive Classifier Boosting (EACB): Exploiting Data-Driven Training for Highly Fault-Tolerant Hardware" Proc. of ICASSP, pp. 3884-3888 (May 2014).

\* cited by examiner

*Primary Examiner* — Jean B Jeanglaude
(74) *Attorney, Agent, or Firm* — Meagher Emanuel Laks Goldberg & Liao, LLP

(57) ABSTRACT

A multiplying analog to digital converter (ADC) including a successive-approximation-register (SAR) analog to digital converter (ADC) having a sample input and a feedback input and an ADC output configured with a feedback path configured to couple the ADC output to a digital to analog converter. A feedback attenuator is disposed in the feedback path, the feedback attenuator being configured to attenuate a feedback signal coupled to the feedback input, the feedback attenuator being configured to provide analog multiplication observed at the ADC output. A barrel shifter is configured to provide digital multiplication of the ADC output. The feedback attenuator may be configured as a divider network. The feedback attenuator may be configured to provide attenuation using only passive components. The feedback attenuator may be configured as a capacitive divider network. The feedback attenuator may be configured to provide attenuation ranging between 1 and 0.5.

20 Claims, 10 Drawing Sheets

Quantization of $M_{IDEAL}$
$$M_{QUANT} = M_S \times M_A \times 2^{M_D}$$
$$M_S = sign(M_{IDEAL})$$
$$M_A = \frac{\left\lfloor \left( \frac{|M_{IDEAL}|}{2^{\lfloor \log_2 |M_{IDEAL}| \rfloor}} - 1 \right) \times 2^4 \right\rfloor}{2^4} + 1$$
$$M_D = 2^{\lfloor \log_2 |M_{IDEAL}| \rfloor}$$
Figure 3A
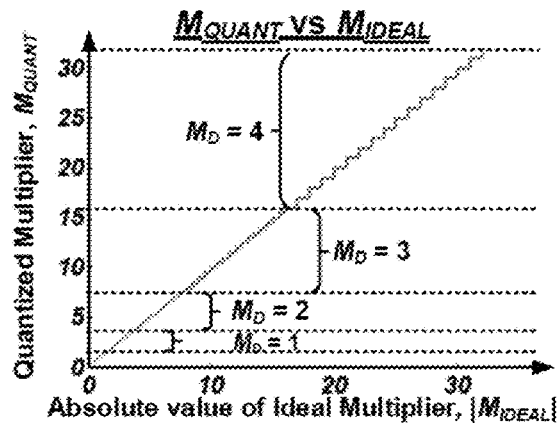
Figure 3B
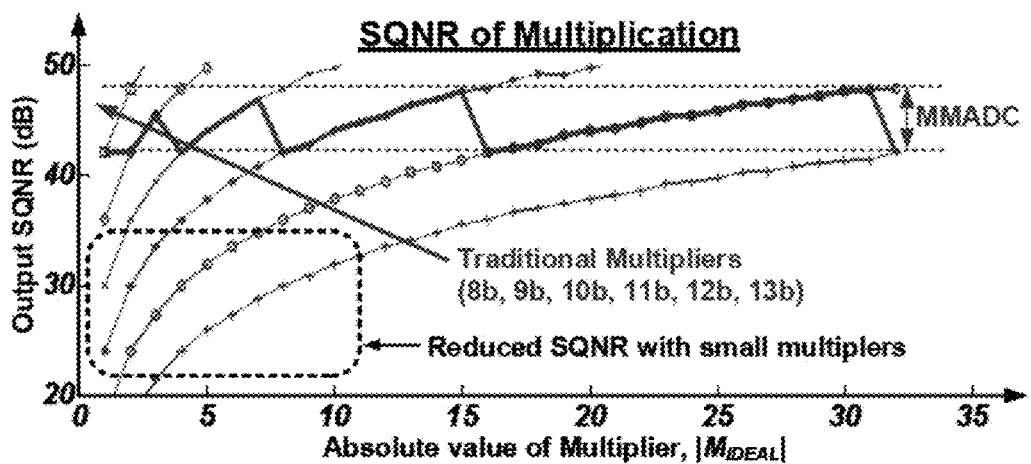
Figure 3C

| Technology | 130 nm CMOS | Power | D: 376.8 nW; A: 286.8 nW @ 20kHz Sampling Rate |
|---|---|---|---|
| Supply Voltage | 1.2 V Analog 1.2 V Digital | DNL, INL | DNL:0.30 (LSB); INL:0.32 (LSB) |
| Resolution | 8 bits | SNDR/ENOB | 45.8 dB @1kHz; 38.9 @9kHz 7.31 @1kHz; 6.17 @9kHz |
| Input Range | 350mV - 850mV | | |
| Sampling Rate | Up to 20 kHz | Achieved FOM | 209 fJ/conv. step @ 1kHz $f_{in}$ |

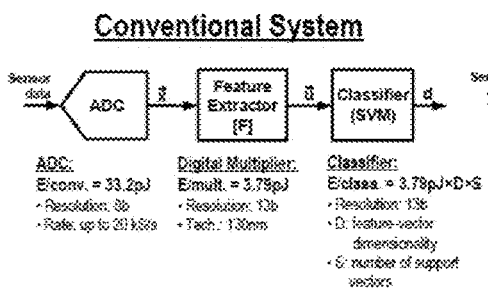
Figure 9A
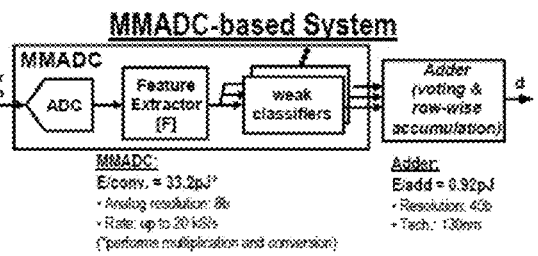
Figure 9B
ECG-based Arrhythmia Detection
Total Energy Saving ~9.7x
Figure 9C
Image-pixel-based Gender Detection
Total Energy Saving ~23x
Figure 9D

MULTIPLYING ANALOG TO DIGITAL CONVERTER AND METHOD

STATEMENT REGARDING FEDERALLY SPONSORED RESEARCH OR DEVELOPMENT

This invention was made with support under Grant No. HR0011-13-3-0002 awarded by the Department of Defense—DARPA. The government has certain rights in the invention.

CROSS-REFERENCE TO PRIOR FILED APPLICATIONS

This application is related to U.S. provisional application 62/118,903 which was filed on Feb. 20, 2015 which is incorporated herein in its entirety.

TECHNICAL FIELD

This invention relates generally to analog to digital converters and in particular machine-learning multiplying analog to digital converters.

BACKGROUND

Embedded sensing systems conventionally perform A-D conversion followed by signal processing to apply specific analyses on sensor data. In many applications, the analysis of interest is inference (e.g., classification). The challenge is that, increasingly, the sensor signals are too complex to model analytically. Machine-learning algorithms are gaining prominence since they overcome the need to model signals analytically, instead enabling data-driven methods of training a classifier. Prior classification systems employ a basic architecture that receives an analog signal for classification. The signal is amplified via an instrumentation amplifier. The amplified signal is fed into an analog to digital converter (ADC). The ADC output is then subjected to a series of digital multiply and accumulate operations (MAC). The result of these amplification, ADC and MAC operations is a classification output. What is needed is a new hardware architecture that enables direct data conversion of information during the ADC process.

SUMMARY OF THE INVENTION

A multiplying analog to digital converter (ADC) is disclosed. The multiplying ADC includes a successive-approximation-register (SAR) analog to digital converter (DAC) having a sample input and a feedback input and an ADC output configured with a feedback path configured to couple the ADC output to a digital to analog converter. A feedback attenuator is disposed in the feedback path, the feedback attenuator being configured to attenuate a feedback signal coupled to the feedback input, the feedback attenuator being configured to provide analog multiplication observed at the ADC output. A barrel shifter is configured to provide digital multiplication of the ADC output. The feedback attenuator may be configured as a divider network. The feedback attenuator may be configured to provide attenuation using only passive components. The feedback attenuator may be configured as a capacitive divider network. The feedback attenuator may be configured to provide attenuation ranging between 1 and 0.5.

The multiplying ADC may also include a multiplying input, configured to receive a quantized multiplier. The quantized multiplier may be configured with a sign bit, a scalar value and an exponent. The scalar value may have a value between 1 and 2. The multiplying ADC may include an analog storage location for storing the input signal for analog to digital conversion with multiple quantized multipliers. The analog storage location may comprise a capacitor.

A method of implementing a multiplying analog to digital converter is also disclosed, the method includes providing a successive-approximation-register (SAR) analog to digital converter (DAC) having a sample input and a feedback input and an ADC output configured with a feedback path configured to couple the ADC output to a digital to analog converter. A feedback attenuator is provided, the feedback attenuator being disposed in the feedback path, the feedback attenuator being configured to attenuate a feedback signal coupled to the feedback input, the feedback attenuator being configured to provide analog multiplication observed at the ADC output. A barrel shifter is provide, the barrel shifter being configured to provide digital multiplication of the ADC output. The feedback attenuator may be configured as a divider network. The feedback attenuator may be configured to provide attenuation using only passive components. The feedback attenuator may be configured as a capacitive divider network. The feedback attenuator may be configured to provide attenuation ranging between 1 and 0.5.

A multiplying input may be provided, the multiplying input being configured to receive a quantized multiplier. The quantized multiplier may be configured with a sign bit, a scalar value and an exponent. The scalar value may have a value between 1 and 2. The multiplying ADC may include an analog storage location for storing the input signal for analog to digital conversion with multiple quantized multipliers. The analog storage location may comprise a capacitor.

BRIEF DESCRIPTION OF THE FIGURES

FIGS. 3A-3C show the multiplying ADC results in multiplier quantization error that scales with 2MD (and thus MQUANT), giving relatively constant output SQNR for multiplication over an arbitrarily large range of multipliers;

FIGS. 9A-9D are graphs and calculations showing detailed energy comparison of the demonstrated applications, using conventional system implementation versus multiplying ADC implementation;

DETAILED DESCRIPTION

Disclosed herein is an analog to digital converter (ADC) that integrates multiplication of input samples. This architecture may also be configured to multiply the input samples with an arbitrary matrix. This enables direct data conversion of information for classification. The multiplying ADC is demonstrated in two applications, (1) ECG-based cardiac-arrhythmia detection and (2) image-pixel-based gender detection, wherein feature extraction and the classification kernel are computed within the ADC operation.

Figure 1A:
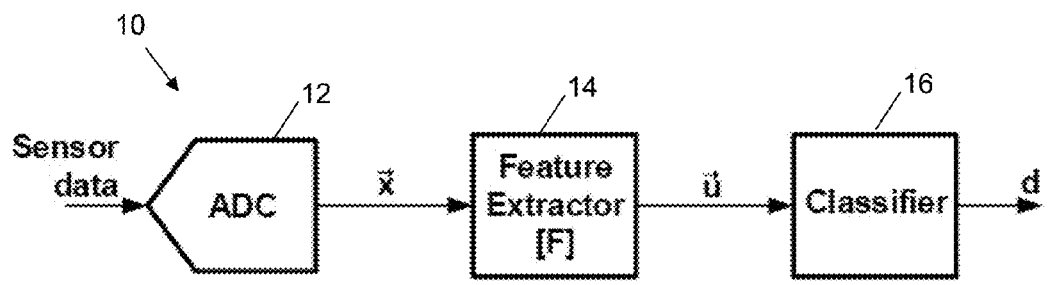
FIG. 1A is block diagram of a conventional classification system.

FIG. 1A is block diagram of a conventional classification system 10. The system 10 includes an ADC 12 configured to receive an analog input (sensor data). The system 10 also includes a feature extractor 14 and a classifier 16 configured to generate a classification output d. The ADC generates a Conventional analog computation faces two key challenges: (1) the energy scales severely with the dynamic range, making multiplication particularly problematic; and (2) the ability to implement specific functions is limited by both the precision and the particular transfer functions achievable by circuit physics. Dynamic range in the multiplying ADC is addressed by exploiting mixed digital and analog multiplication, as described below.

Figures 1B, 1C:
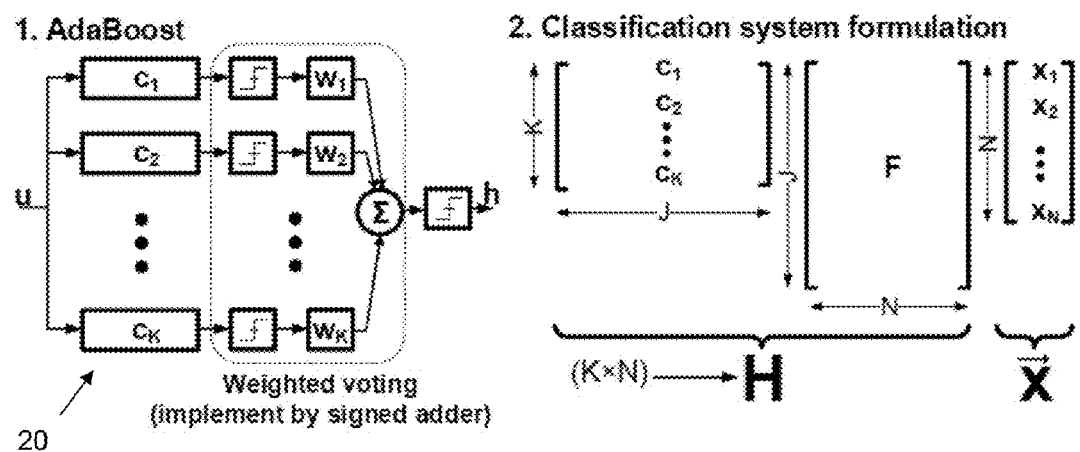
FIG. 1B is a block diagram of an ensemble of K linear classifiers combined with linear feature extraction F in the matrix H, for implementation with a multiplying analog to digital converter (ADC)
FIG. 1C is a pictorial diagram showing how AdaBoost enables an ensemble of K linear classifiers combined with linear feature extraction F in the matrix H.

FIG. 1B is a block diagram of classifier 20 configured with ensemble of K linear classifiers 22. The need to implement precise functions is overcome by employing a machine-learning algorithm known as Adaptive Boosting (AdaBoost). As shown in FIG. 1C, AdaBoost enables the ensemble of K linear classifiers $\vec{C}_l$ which can be combined with linear feature extraction F in the matrix H, for implementation with a multiplying ADC combined with linear feature extraction F in the matrix H. In general, AdaBoost uses an ensemble of weak classifiers to form a strong classifier (in machine learning, a weak classifier is defined as one that cannot be trained to fit arbitrary data statistics, a strong classifier is defined as one that can). The benefit of AdaBoost is that very low performing weak classifiers can be used, with required performance only marginally better than 50/50 guessing. This opens the possibility for circuit implementations preferred in terms of energy and hardware efficiency. In particular, linear classifiers can be used, which simply involve a dot product between a feature vector $\vec{u}$ (derived from N-point input data $\vec{x}$) and a classification vector $\vec{C}_l$.

As shown in FIG. 1A, typically $\vec{u}$ must be derived explicitly because conventional strong classifiers apply non-linear operations. However, if feature extraction is linear, as is often the case [e.g., the applications considered use discrete wavelet transform (DWT) and principal component analysis (PCA)], then an ensemble of K linear classifiers $\vec{c}_1 \ldots \vec{c}_K$ can be combined with the feature-extraction matrix F, giving a single K×N matrix H. As disclosed herein, the number of weak classifiers K required in AdaBoost is typically low, making system energy with the multiplying ACD of same order as just an ADC.

Figure 2A:
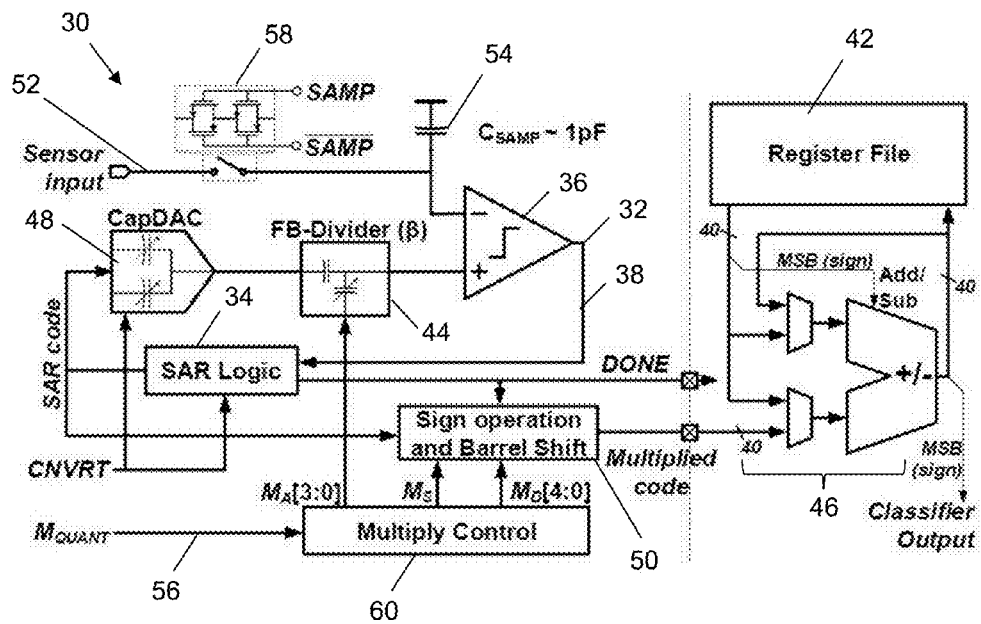
FIG. 2A is a block diagram of a multiplying ADC 30, which implements multiplication within an 8-bit successive-approximation-register (SAR) architecture.

FIG. 2A is a block diagram of a multiplying ADC 30, which implements multiplication within an 8-bit successive-approximation-register (SAR) architecture at negligible energy cost. The multiplying ADC 30 is based on a SAR ADC which basically implements a binary search algorithm. The ADC 30 includes a comparator 36 with a sample input 52 and an output 32 tied to a feedback path or loop 38. The feedback path 38 is coupled to SAR logic 34. To implement a binary search algorithm, an 8-bit register in the SAR logic 34 is coupled to digital to analog converter (DAC) 48. The DAC 48 output is generally varied via a binary search until the output of the DAC equals the sample signal at the inverting input of the comparator 36. The contents of the SAR logic register is output to accumulator 46 and ultimately stored as the ADC output in register 42.

The multiplying ADC 30 implements mixed analog/digital multiplication, with analog multiplication implemented passively via feedback attenuation by a feedback attenuator 44 and digital multiplication implemented by a barrel shifter 50. Implementing attenuation in the feedback loop results in multiplication at the comparator output 32. Since the feedback attenuation is implemented using passive components, the resulting multiplication is more precise than implementations using active components to implement multiplication. In this example the feedback attenuator 44 is implemented using a capacitor divider network, additional detail are provided in FIG. 4. To overcome dynamic-range limitations, the ADC 30 is configured with a multiplying input 56, configured to receive a quantized multiplier. Multiply control logic 60 generally separates the quantized multiplier $M_{QUANT}$ coupled to the multiplying input 56 as follows. The quantized multiplier $M_{QUANT}$ is broken into three parts: a sign bit $M_S$, a 4-bit scalar (unsigned analog multiplier) represented by $M_A$, and a 5-bit signed exponent $M_D$. The final $M_{QUANT} = M_S \times M_A \times 2^{M_D}$. The feedback loop 38 is coupled to a feedback attenuator 44 (FB-Divider) to implement the 4-bit scalar (unsigned analog multiplier) represented by $M_A$.

$M_A$ is applied passively through attenuation in the feedback path via the feedback attenuator 44. Feedback attenuator 44 implements feedback attenuation β ranging from 1 to 16/(16+15)=16/31, realizing multiplication by $M_A$ with values ranging from 1 to 31/16 (in steps of 1/16). The ADC supports signed inputs with respect to a nominally mid-rail bias $V_{MID}$. Signed multiplication is thus supported by using $M_S$ to either pass through or give the negative of the ADC code. Digital multiplication, based on the exponent $M_D$, is then performed on the resulting 8-b code via barrel shifter 50, implementing multiplication by powers of 2 ($2^{-16}, 2^{-15}, \ldots 2^{14}, 2^{15}$). With a 5-bit $M_D$, shifting by up to 32 bits is supported, giving a 40-bit output. It should be understood additional bits may be provided to increase the dynamic range of the ADC 30. ADC 30 also includes control inputs SAMP and $\overline{SAMP}$ configured to acquire an input signal for conversion as shown generally by reference number 58. An analog storage location 54 may be provided to hold the sample signal provided at sample input 52 for multiple A to D conversion. A plurality of quantized multipliers may then be coupled to the multiplying input 56 to support matrix multiplication.

FIGS. 3A-3B expresses the overall quantized multiplier value $M_{QUANT}$ (with respect to an ideal, unquantized multiplier $M_{IDEAL}$) and illustrates the multiplication achieved. The disclosed approach has two benefits. First, regardless of the overall multiplier, the analog input range is reduced by only the maximum value of $M_A$, namely a factor of $31/16 \approx 2$ (giving analog input range 0.35V to 0.85V). Second, through barrel shifting, arbitrarily large multiplier values can be supported at low hardware cost of additional bits in the barrel shifter. The resulting multiplication has quantization noise that scales with $2^{M_D}$ (i.e., with the multiplier value). As seen in the simulation of FIG. 3C, traditional linear-quantized multiplication (shown for the 8- to 13-b levels) causes output SQNR to vary widely with the multiplier, resulting in inefficient use of dynamic range. This particularly degrades performance for lower-valued multipliers, which often occur with equal or substantially higher frequency in signal-processing applications (such as the two considered). Alternatively, the multiplying ADC results in relatively constant SQNR over an arbitrarily large range of multipliers, achieving performance substantially greater than the 8-b level, yet with passive 4-b multiplication hardware (FB-divider) and barrel shifting.

Figure 2B:
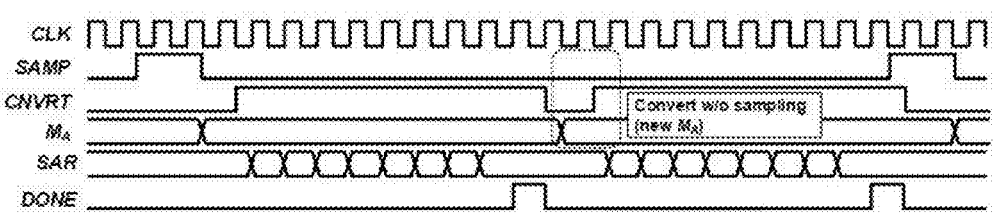
FIG. 2B is a waveform diagram for the block diagram of FIG. 2A.

To implement matrix multiplication, an MMADC input sample must be multiplied by the K elements in each column of H. To realize this, input sampling is performed on a separate capacitor $C_{SAMP}$, rather than within the DAC 48 (whose charge must be reset following each conversion). Thus, as shown in the waveforms of FIG. 2B, an input sampled once (by SAMP) can be applied to the multiplying ADC multiple times (enable by CNVRT) with different multiplier values ($M_A$, $M_D$). Row-wise accumulation of products is then performed by a digital adder (not implemented on the chip). Since the sampled input must be held for the duration of K conversions, leakage is a concern. The sampling switch consists of a series of two CMOS transmission gates (as shown in FIG. 1), exploiting the stacked effect to exponentially reduce leakage. For the analog input range, simulated sample error <0.5 LSB is achieved for K up to 50.

Figure 4:
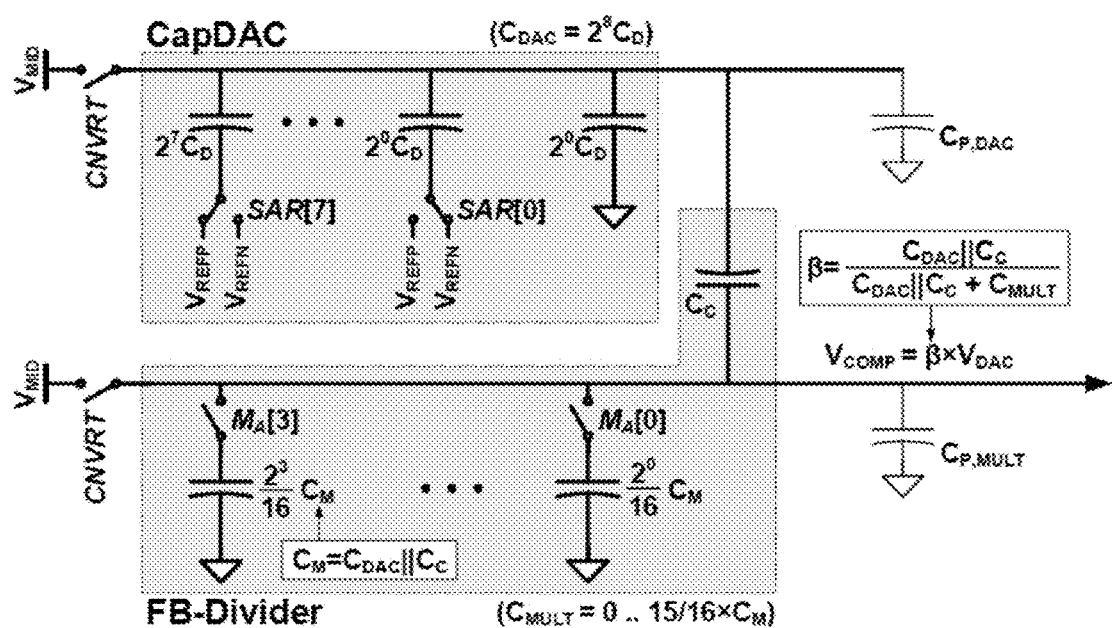
FIG. 4 is a schematic diagram showing the SAR feedback path, composed of CapDAC and feedback attenuator (FB-Divider), wherein the feedback attenuator applies a switchable attenuation factor of β through capacitive division implemented with $C_{MULT}$.

FIG. 4 shows the DAC 48 (CapDAC) and feedback attenuator 44 (FB-Divider). To enable bipolar inputs (and signed multiplication), both the output of the feedback attenuator 44 and the output of the CapDAC 48 are switched to $V_{MID}$ at the start of a conversion (i.e., CNVRT=0). At the same time, feedback attenuation β is set by $C_{MULT}$, by switching in composing unit capacitors. Nominally, the unit capacitors have a value $C_M$ set to $C_{DAC}||C_C$. Using, $C_C \approx 380$ fF, a $C_M$ of modest value is required (~25 fF). Regarding parasitic capacitances, thanks to switching to $V_{MID}$, $C_{P,DAC}$ does not degrade ADC linearity. $C_{P,MULT}$ leads to a constant term in the denominator of β, causing error in the analog multiplier (measured below). Further, separating input sampling from the CapDAC causes the voltage of critical bit decisions to vary with input, leading to non-linearity (measured below) due to variation of sampling-switch charge injection and comparator offset. However, both error sources are readily overcome thanks to the AdaBoost algorithm, where iterative training of weak classifiers enables errors in all i−1 iterations to be compensated during training of the $i^{th}$ classification vector $\vec{C_i}$.

Figure 5A:
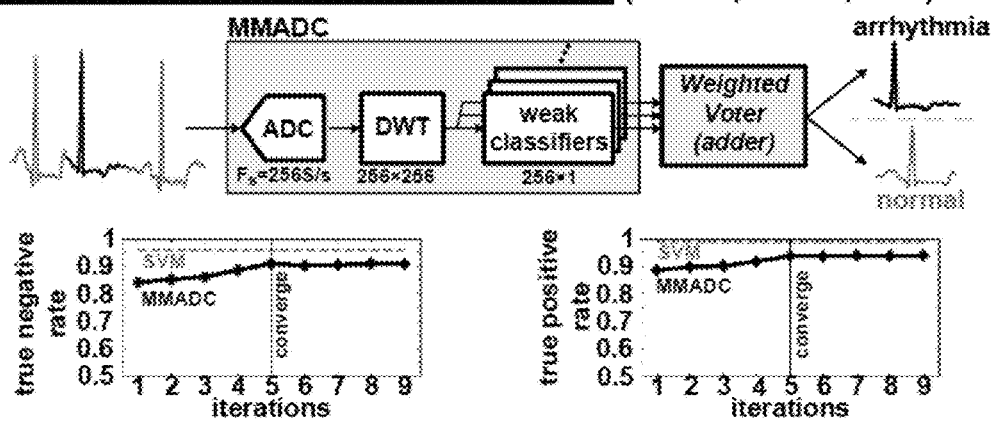
FIGS. 5A and 5B show two application demonstrations implemented via the multiplying ADC achieve classification performance near an SVM with estimated 9.7× and 23× lower energy, respectively, compared to a conventional system.
Figure 5B:
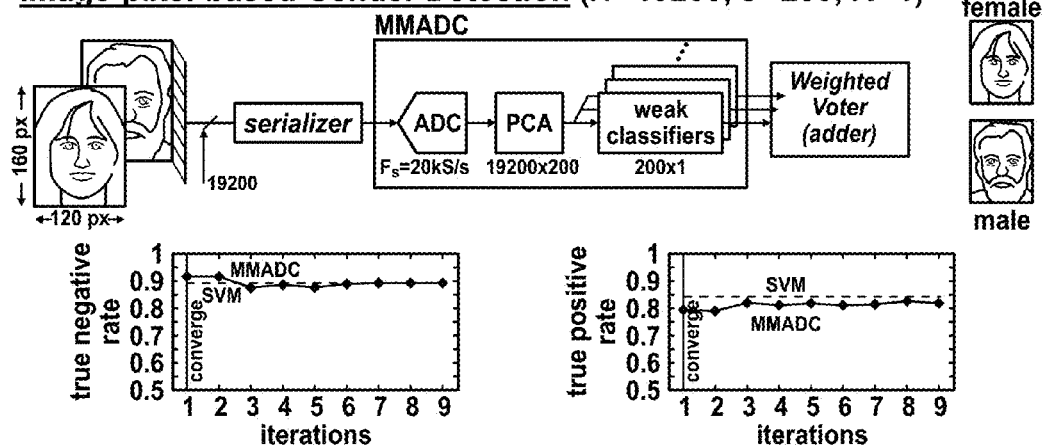

FIG. 5 shows the parameters and measured performance of two applications implemented using the multiplying ADC. Patient ECG from and image-pixel data from are replayed by an arbitrary waveform generator and presented to the multiplying ADC along with multiplier values for the matrix H, which is formed from the feature-extraction matrix F (DWT and PCA, respectively) and the classification vectors $\vec{c_1} \ldots \vec{c_K}$, derived from off-line training. As conventional, 10-fold validation is performed to divide the dataset for training and testing. The performance of a MATLAB implemented support-vector machine (SVM), a widely-used non-linear strong classifier, is also shown, illustrating that the multiplying ADC successfully achieves strong classification performance, near an ideal SVM. Convergence is achieved with 5 and 1 weak classifiers, respectively, giving overall energy savings of 9.3× and 24× compared to a conventional system, as in FIG. 1.

Figure 6A:
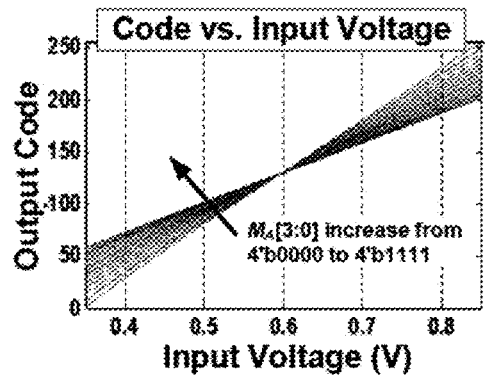
FIGS. 6A-6D are graphs showing measurement summaries of a prototype multiplying ADC.
Figure 6B:
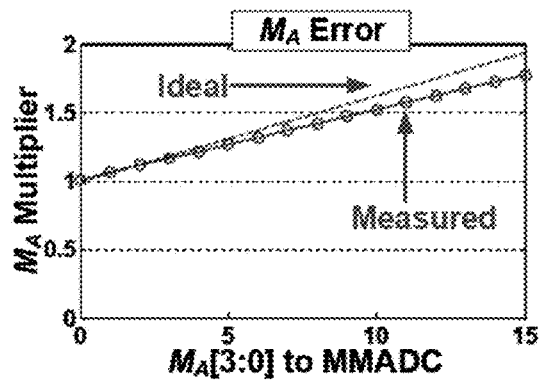
Figure 6C:
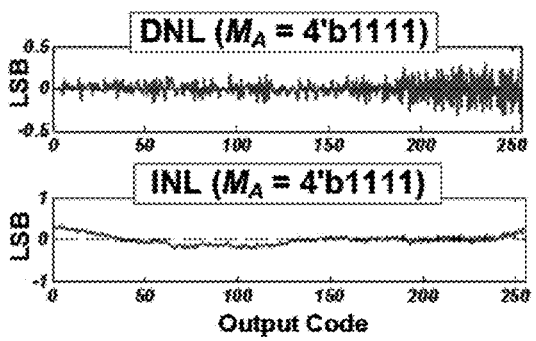
Figure 6D:
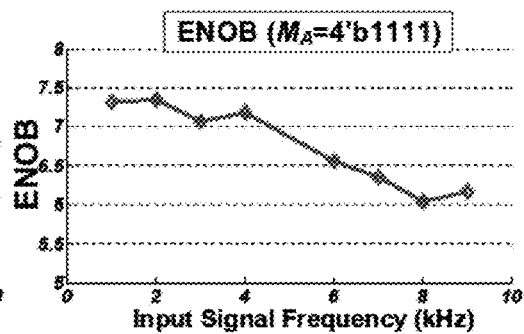
Figures 6E, 7:
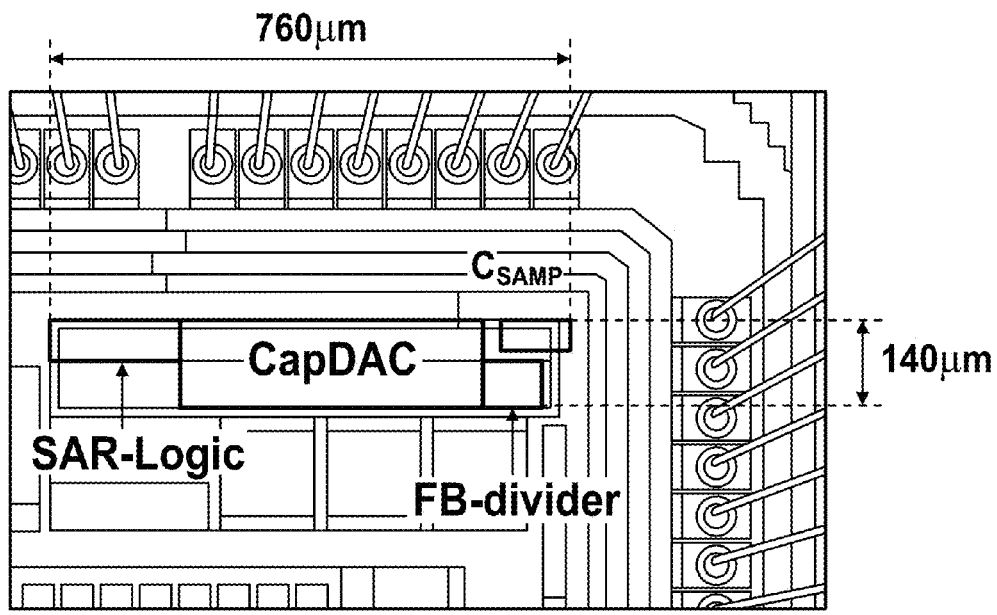
FIG. 6E is a table that summarizes the measurement results of the prototype multiplying ADC shown in FIG. 7.
FIG. 7 is a Die photograph of multiplying ADC, implemented in 130 nm CMOS.
Figure 8A:
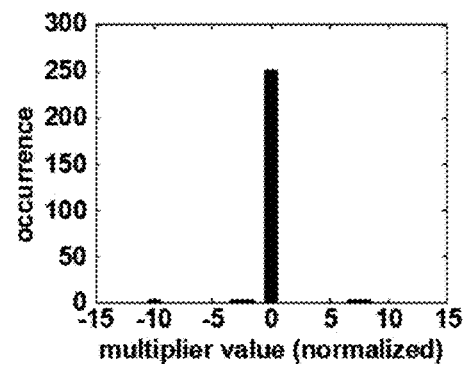
FIGS. 8A-8D are graphs showing the analysis of demonstrated applications shows the comparative benefits achieved by multiplying ADC, compared to conventional linear-quantized multiplication.
Figure 8B:
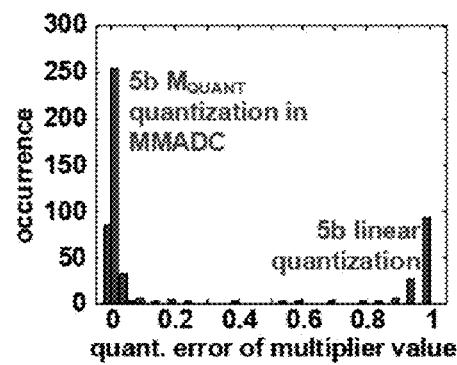
Figure 8C:
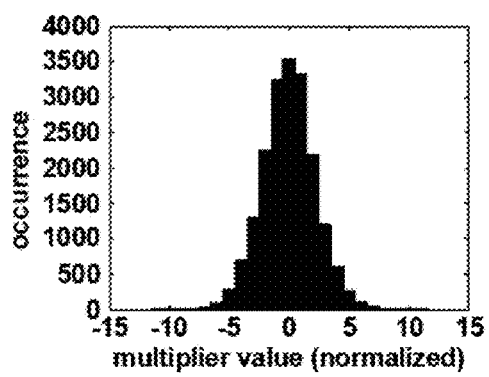
Figure 8D:
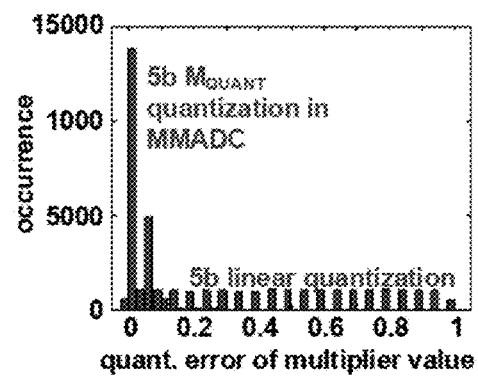
Figure 10A:
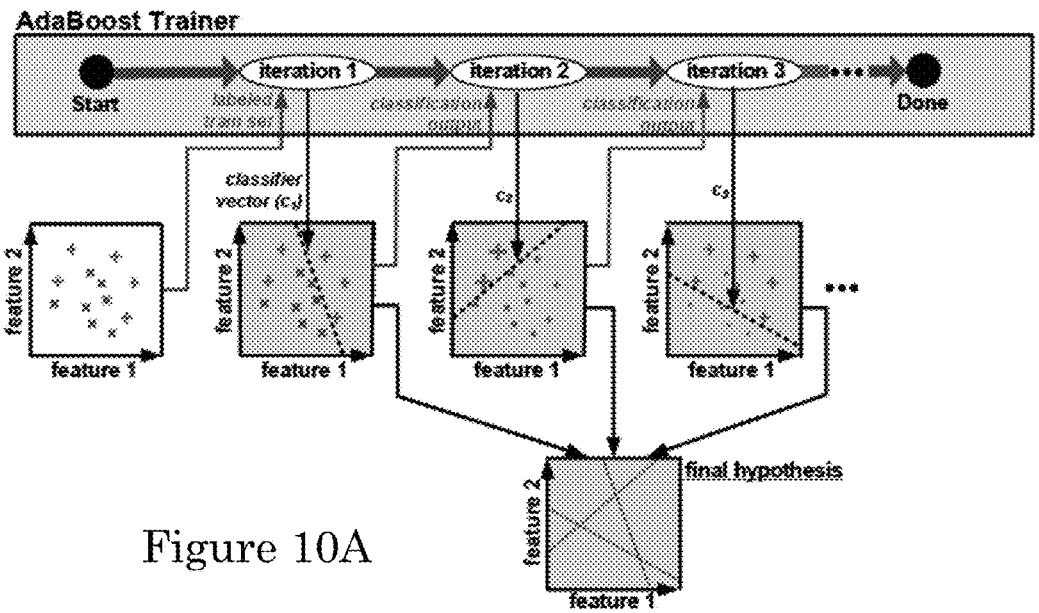
FIG. 10A is a block diagram of an AdaBoost trainer.
Figure 10B:
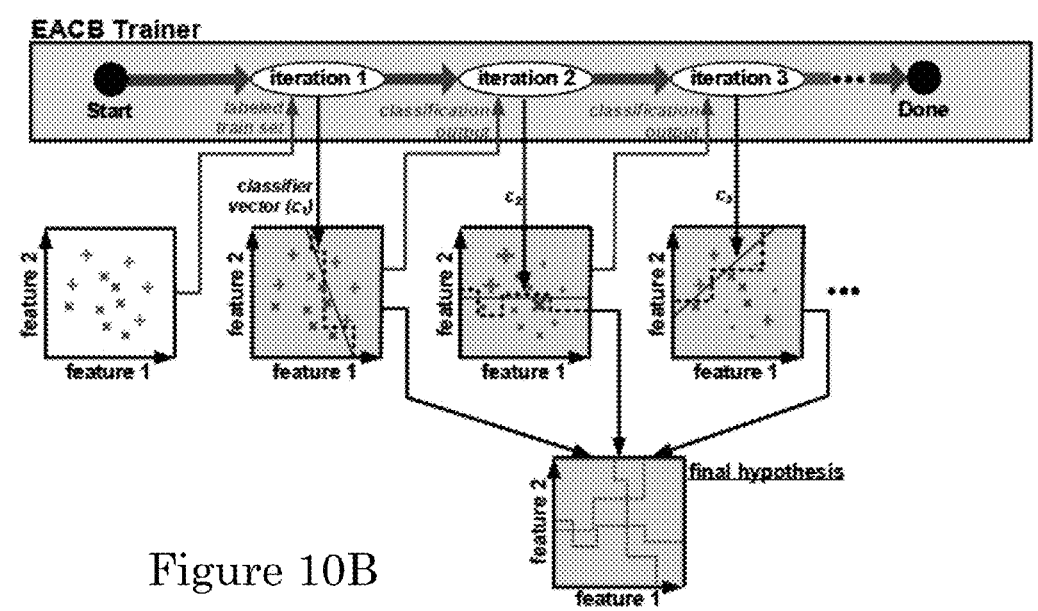
FIG. 10B is a block diagram of an EACB trainer.

FIG. 7 is a Die photograph the multiplying ADC is prototyped in a 130 nm CMOS process. FIG. 6 summarizes the measurement results. The multiplying ADC performs conversions at a rate up to 20 kS/s (scalable down at constant energy). Slight deviation of the multiplier value is measured (~9%) due to $C_{P,MULT}$. The SNDR is measured to be 45.8 dB (low frequency) and 38.9 dB (near Nyquist), giving an ADC FoM.

FIGS. 8A-8D are graphs showing the analysis of demonstrated applications shows the comparative benefits achieved by multiplying ADC, compared to conventional linear-quantized multiplication. The histogram of multiplier values shows that small-valued multipliers occur with high frequency. Compared with 5-b linear quantization of the multiplier value, the multiplying ADC, which also performs 5-b quantization of the multiplier value [1-b sign (MS) and 4-b analog multiplier (MA)] but in conjunction with barrel shifting, achieves much lower effective quantization error. The resulting quantization error of multiplication (assuming uniformly distributed multiplicand) is shown in the output SQNR plot of FIG. 3C.

FIGS. 9A-9D are graphs and calculations showing detailed energy comparison of the demonstrated applications, using conventional system implementation versus multiplying ADC implementation. The estimated energy numbers for digital multiplication and addition are derived from post-layout simulation in the 130 nm technology employed (and are also found to be consistent with previous reports based on prototype measurements). By eliminating the need for explicit multiplication for feature extraction and classification, the multiplying ADC results in estimated energy savings of 9.7× and 23×, respectively.

It should be understood that many variations are possible based on the disclosure herein. Although features and elements are described above in particular combinations, each feature or element can be used alone without the other features and elements or in various combinations with or without other features and elements.

What is claimed is:

1. A multiplying analog to digital converter comprising:
   a successive-approximation-register (SAR) analog to digital converter (ADC) having a sample input and a feedback input and an ADC output configured with a feedback path configured to couple the ADC output to a digital to analog converter;
   a feedback attenuator disposed in the feedback path, the feedback attenuator being configured to attenuate a feedback signal coupled to the feedback input, the feedback attenuator being configured to provide analog multiplication observed at the ADC output; and
   a barrel shifter configured to provide digital multiplication of the ADC output.

2. The multiplying analog to digital converter of claim 1 wherein the feedback attenuator is configured as a divider network.

3. The multiplying analog to digital converter of claim 1 wherein the feedback attenuator is configured to provide attenuation using only passive components.

4. The multiplying analog to digital converter of claim 1 wherein the feedback attenuator is configured as a capacitive divider network.

5. The multiplying analog to digital converter of claim 1 wherein the feedback attenuator is configured to provide attenuation ranging between 1 and 0.5.

6. The multiplying analog to digital converter of claim 1 further comprising a multiplying input, configured to receive a quantized multiplier.

7. The multiplying analog to digital converter of claim 6 wherein the quantized multiplier is configured with a sign bit, a scalar value and an exponent.

8. The multiplying analog to digital converter of claim 7 wherein the scalar value has a value between 1 and 2.

9. The multiplying analog to digital converter of claim 6 further comprising an analog storage location for storing the input signal for analog to digital conversion with multiple quantized multipliers.

10. The multiplying analog to digital converter of claim 9 wherein the analog storage location comprises a capacitor.

11. A method of implementing a multiplying analog to digital converter, the method comprising:
providing a successive-approximation-register (SAR) analog to digital converter (ADC) having a sample input and a feedback input and an ADC output configured with a feedback path configured to couple the ADC output to a digital to analog converter;
providing a feedback attenuator disposed in the feedback path, the feedback attenuator being configured to attenuate a feedback signal coupled to the feedback input, the feedback attenuator being configured to provide analog multiplication observed at the ADC output; and
providing a barrel shifter configured to provide digital multiplication of the ADC output.

12. The method of claim 11 wherein the feedback attenuator is configured as a divider network.

13. The method of claim 11 wherein the feedback attenuator is configured to provide attenuation using only passive components.

14. The method of claim 11 wherein the feedback attenuator is configured as a capacitive divider network.

15. The method of claim 11 wherein the feedback attenuator is configured to provide attenuation ranging between 1 and 0.5.

16. The method of claim 11 wherein a multiplying input is provided, the multiplying input being configured to receive a quantized multiplier.

17. The method of claim 16 wherein the quantized multiplier is configured with a sign bit, a scalar value and an exponent.

18. The method of claim 17 wherein the scalar value has a value between 1 and 2.

19. The method of claim 16 comprising providing an analog storage location for storing the input signal for analog to digital conversion with multiple quantized multipliers.

20. The method of claim 19 wherein the analog storage location comprises a capacitor.

* * * * *